United States Patent [19]

Weaver

[11] Patent Number: 4,896,372

[45] Date of Patent: Jan. 23, 1990

[54] PULSE WIDTH MODULATOR FOR AM-RF TRANSMITTER

[75] Inventor: Bryan A. Weaver, Dallas, Tex.

[73] Assignee: Varian Associates, Inc., Palo Alto, Calif.

[21] Appl. No.: 832,630

[22] Filed: Feb. 25, 1986

[51] Int. Cl.$^4$ ............................................. H03F 3/38
[52] U.S. Cl. ..................................... 455/108; 330/10; 332/109; 375/22
[58] Field of Search ................... 375/22, 23; 455/108; 330/10; 332/9, 109–111

[56] References Cited

U.S. PATENT DOCUMENTS

| | | | |
|---|---|---|---|
| 3,413,570 | 11/1968 | Brueue et al. | 375/22 |
| 3,506,920 | 4/1970 | Swanson | 455/108 |
| 3,588,744 | 6/1971 | Swanson | 332/9 |
| 3,835,419 | 9/1974 | Milne et al. | 332/16 R |
| 4,186,346 | 1/1980 | Wysocki | 325/144 |
| 4,319,359 | 3/1982 | Wolf | 375/22 |
| 4,524,335 | 6/1985 | Yokoyama | 330/10 |

FOREIGN PATENT DOCUMENTS 2390858 5/1978 France .

OTHER PUBLICATIONS

Telecommunications and Radio Engineering, vol. 32, pp. 144–147, 1979.

*Primary Examiner*—Benedict V. Safourek
*Attorney, Agent, or Firm*—Stanley Z. Cole; John C. Yakes; Allan M. Lowe

[57] ABSTRACT

An RF-AM transmitter of the type including a power pulse amplifier driving an RF amplifier with a modulating voltage via a low pass filter includes a pulse width modulator for deriving variable frequency pulses having a frequency that is a direct function of an RMS like function of the amplitude and frequency of an information source; the width of the pulses is determined by the instantaneous amplitude of the information signal source. The pulse width modulator includes a constant amplitude, variable frequency triangular wave voltage controlled oscillator responsive to a DC signal representing the frequency and amplitude of the information source. In response to amplitude crossovers between the variable frequency triangular wave and the information source, transitions in the pulse width modulated wave are derived.

35 Claims, 3 Drawing Sheets

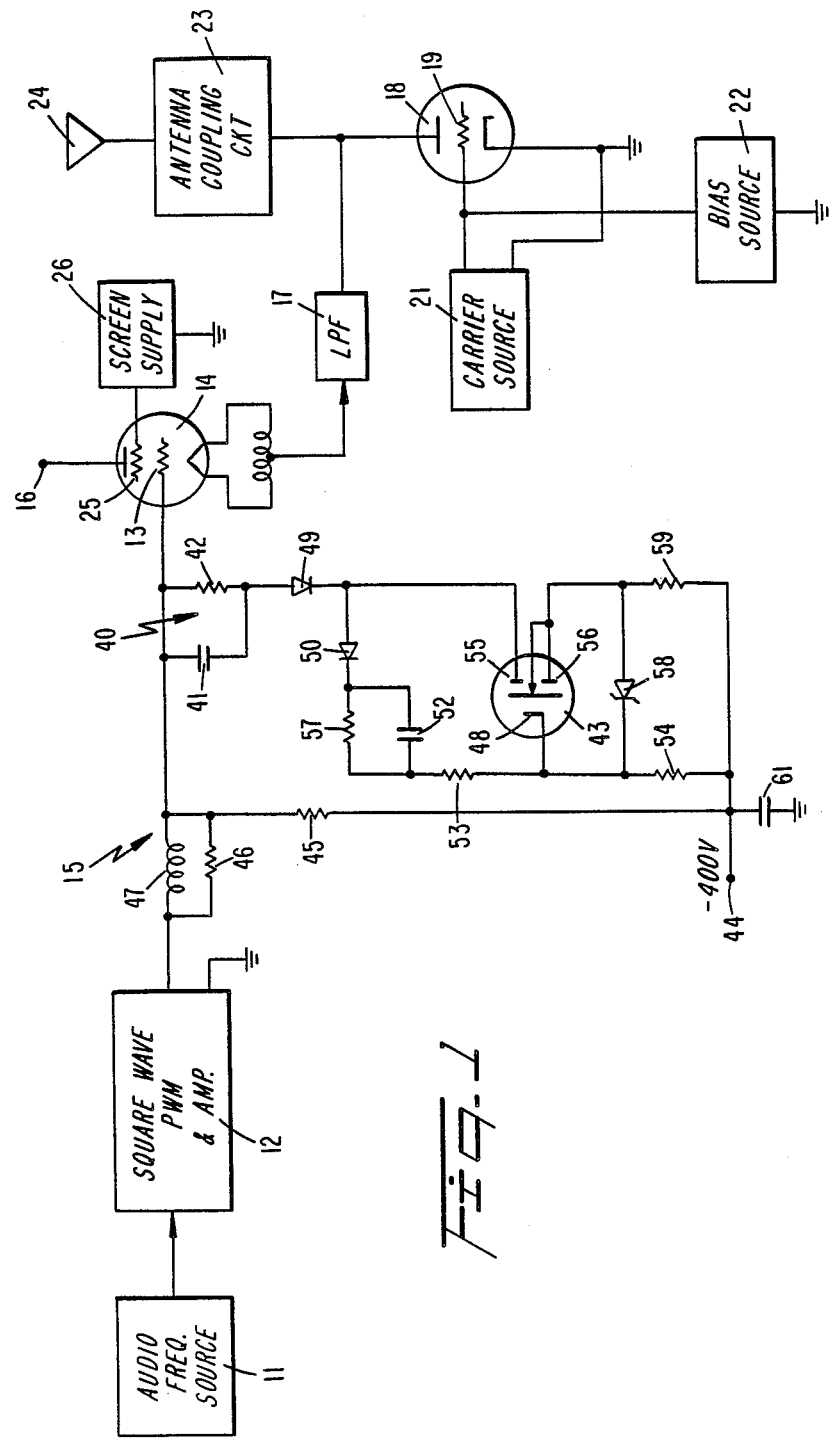

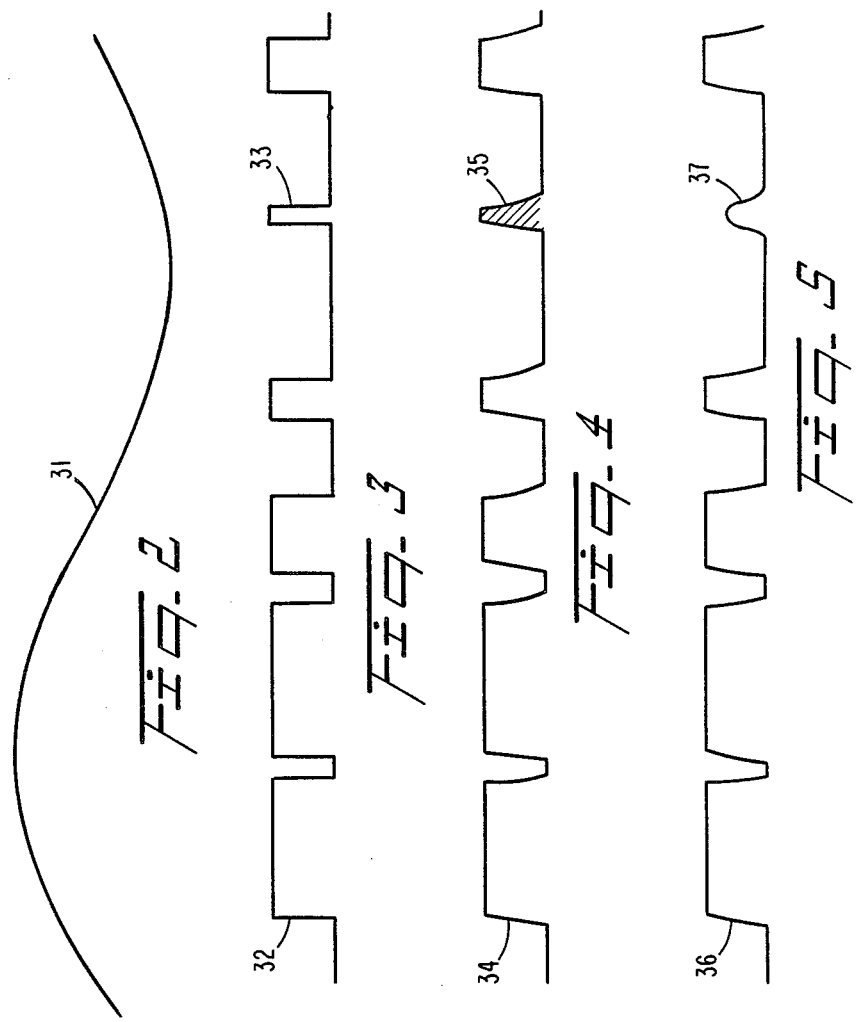

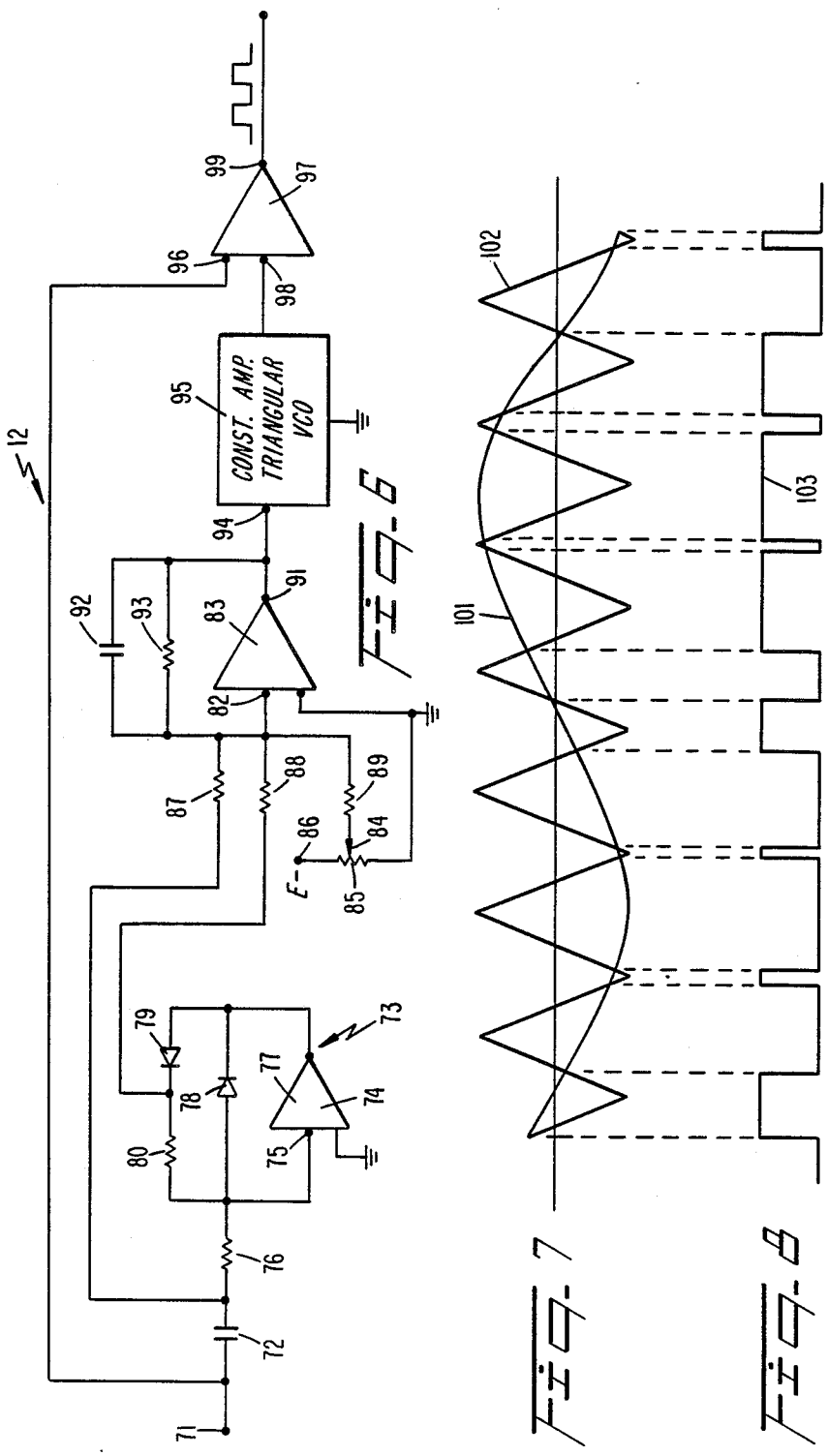

4,896,372

PULSE WIDTH MODULATOR FOR AM-RF TRANSMITTER

TECHNICAL FIELD

The present invention relates generally to amplitude modulated (AM) radio frequency (RF) transmitters of the type including a pulse width modulator for driving a power pulse amplifier which supplies energizing voltage to a power supply circuit of an RF amplifier via a low pass filter and to pulse width modulators particularly adapted for such transmitters. In accordance with one particular aspect of the invention, the frequency of a pulse width modulated signal derived by the modulator is a direct function of the frequency and amplitude of an information signal. In accordance with another aspect of the invention, a pulse width modulator includes a variable frequency triangular wave oscillator having an output that is compared in amplitude with an information signal so that transitions in the pulse width modulated wave occur in synchronism with each change in the relative polarity of the information signal and the output of the triangular wave source.

BACKGROUND ART

One type of AM-RF transmitter includes a pulse width modulator responsive to an information signal source for driving a power pulse amplifier connected with a low pass filter in a power supply circuit for an RF amplifier. Examples of specific transmitters of this type are found in Swanson U.S. Pat. Nos. 3,506,920 and 3,588,744, as well as Bruene et al, U.S. Pat. No. 3,413,570.

In the Swanson patents and in several embodiments of the Bruene et al patent the pulse width modulator operates at a fixed frequency. The width of the pulses is varied in response to the instantaneous amplitude of the information signal supplied to the modulator. In response to the instantaneous amplitude of the information signal having a zero value, the two levels of the pulse width modulated signal during a particular period of the signal are equal in duration. During peak positive portions of the information signal the pulse width modulated signal typically has a high level for a much greater time than a low level. In contrast, during peak negative portions of the information signal, the length of the high level portion of the pulse width modulated signal is considerably less than the length of the low level portion of the signal. As the frequency of the information signal increases and decreases the rate of change between sequential pulses of transitions between the high and low levels respectively increases and decreases.

The fixed frequency of the pulse width modulated signal is selected to satisfy frequency performance requirements of the transmitter in replicating the information signal source. Typically, the information signal source is an audio source, such as voice or music. In general, the highest audio frequency which must be reproduced at the output of the low pass filter determines how high the fixed frequency of the pulse width modulated source is to be. For example, a transmitter designed to provide a maximum response for an audio signal having a maximum frequency of 10 KHz requires a much higher operating frequency for the pulse width modulator than a transmitter designed to provide a maximum response capable of handling a 5 KHz signal.

Another important consideration in determining the fixed pulse width modulation frequency is the amount of tolerable distortion. In general, the lowest distortion for the highest frequency information signals is achieved by having a high ratio of fixed pulse width modulation frequency to the highest frequency of the information source.

An additional consideration in selecting the fixed frequency of the pulse width modulator is modulator conversion efficiency. In a pulse type transmitter including a high power pulse amplifier, as included in transmitters of the type with which the present invention is utilized, switching losses increase as pulse frequency increases. In other words, as the ratio of pulse duration time to switching time becomes greater, switching losses decrease.

The stated considerations regarding distortion and efficiency are contrary to each other. In consequence, the designer of this type of RF-AM transmitter must make a compromise in selecting the fixed frequency of the pulse width modulator. Usually the compromise involves selecting the lowest frequency which will satisfy distortion limits for the highest information frequency the transmitter is designed to handle, i.e., the highest information frequency for which the transmitter specification requires a distortion measurement. If no distortion measurement is required above 5000 Hz, i.e., the modulation handled by the transmitter has a maximum frequency of 5000 Hz, a pulse frequency in the 50-60 KHz range is usually selected. If distortion measurements must be made at 7500 Hz, a pulse frequency of 70 KHz or higher is required, resulting in a lower efficiency than occurs with a transmitter having a 50 KHz fixed pulse width modulation frequency.

In FIG. 6 of the Bruene et al patent is disclosed a transmitter of the type including a variable frequency pulse width modulator which drives a power pulse amplifier for supplying a DC voltage to an anode-cathode path of an RF amplifier by way of a low pass, integrating filter. The variable frequency pulse width modulator of the Bruene et al patent, however, does not satisfy the distortion and efficiency problems of the prior art fixed frequency pulse width modulated transmitters. In the Bruene et al transmitter, the instantaneous amplitude of an audio signal source controls the frequency of an assymetrical multivibrator. The multivibrator derives a bilevel signal having a constant duration high level and a variable duration low level. The variable duration low level has the shortest duration when the modulating information signal source has a positive peak value; the variable duration low level is longest in response to the information having a negative peak value.

The switching times of the assymetrical multivibrator, hence the transitions from the high to the low level, are determined by the instantaneous value of the information source at the time a transition is to take place. In essence, the assymetric multivibrator samples the amplitude of the information signal source at the time of a transition, and the sampled amplitude determines the length of the variable, low level duration. There is a considerable likelihood that variations in the information signal source which occur during the fixed duration high level output of the assymetric multivibrator are not reflected and are not replicated in the output of the low pass filter driving the RF amplifier. Hence, distortion with the variable frequency device disclosed in FIG. 6 of Bruene et al is very likely. The problem of distortion as occurs in the fixed frequency pulse width modulator is not considered or inherently solved by the FIG. 6 configuration of Bruene et al.

It is, accordingly, an object of the present invention to provide a new and improved AM-RF transmitter including a pulse width modulator which causes the transmitter to operate with higher efficiency and lower distortion.

Another object of the present invention is to provide a new and improved RF-AM transmitter of the type including a pulse width modulator, wherein the frequency of the pulse width modulated signal is varied in such a manner as to enable high frequency variations of an information signal to be accurately reproduced, and to enable the transmitter to operate in a high efficiency mode.

An additional object of the present invention is to provide a new and improved AM-RF transmitter of the type including a pulse width modulator wherein a modulating signal applied to a power supply terminal of an RF amplifier has reduced distortion, particularly at higher frequencies of an information signal.

DISCLOSURE OF INVENTION

In accordance with one aspect of the present invention, a radio transmitter for transmitting an RF carrier amplitude modulated by an information signal comprises a pulse width modulator responsive to the information signal for deriving a pulse width modulated signal having pulses with widths representing the amplitude of the information signal and a frequency that is a direct function of the frequency and amplitude of the information signal. Thereby the information signal is sampled by the pulse width modulator at a frequency that increases and decreases as the frequency and amplitude of the information signal increase and decrease. A power amplifier responds to the variable frequency pulse width modulated signal to derive a high power signal that is a substantial replica of the pulse width modulated signal. A low pass filter responds to the high power signal to derive a signal that is a substantial replica of the information signal. A DC power supply for an RF amplifier includes the low pass filter and the power amplifier.

By varying the frequency of the pulse width modulated signal derived by the modulator as a direct function of the frequency and amplitude of the information signal, i.e., as the frequency of the information signal increases the frequency of the pulse width modulated signal increases and as the amplitude of the information signal increases the frequency of the pulse width modulated signal increases, distortion of high level high frequency components of the information signal is obviated, while simultaneously providing higher efficiency for the pulse power and RF amplifiers. The higher efficiency occurs because during most of the program time, i.e., while a finite non-zero signal is derived by the information source, the frequency of the pulse width modulated signal is relatively low. Information signals having high amplitude and high frequency are subject to large slopes and large slope changes. To reconstitute such signals, the pulse width modulator sampling frequency must be appropriately increased. Therefore, distortion is minimized in the present invention by increasing the sampling frequency as the amplitude and frequency of the information signal increase.

The distortion which occurs in a transmitter having a fixed frequency pulse width modulator occurs when the ratio of the pulse frequency to the highest audio frequency is not sufficiently high. If the pulse frequency is increased as the high audio frequencies occur in the information source, the distortion which occurs in the fixed frequency pulse width modulator transmitters is avoided or substantially reduced.

In accordance with a further aspect of the invention, a variable frequency pulse width modulator produces a variable frequency output that is a function of an AC information signal by employing a variable frequency voltage controlled oscillator for deriving an output having a constantly changing amplitude, in particular a triangular wave output. A DC control voltage for the triangular wave oscillator frequency is derived in response to the AC information signal. In response to the AC information signal and the triangular wave output a variable frequency bilevel pulse width modulated signal having pulse widths that are a function of the instantaneous amplitude of the AC input signal is derived. The variable frequency bilevel pulse width modulated signal has transitions that are controlled so that each transition occurs in synchronism with each change in the relative polarity of the information signal and the triangular wave output. Thus, a transition occurs each time the information signal exceeds the triangular wave output and vice versa. The information signal amplitude is thus sampled each time the triangular wave and information signal amplitudes cross each other.

Because of the instantaneous comparison between the information signal and the variable frequency triangular wave source, the previously discussed distortion problems which occur in the Bruene et al system are substantially avoided. In particular, the sampling times of the present invention invariably increase and decrease with increases and decreases of the information signal. In Bruene et al, the sampling times do not necessarily change with the frequency of the information signal.

The variable frequency triangular wave is of particular advantage because it provides a linear relationship between the amplitude of the information signal and the durations of the pulses of the pulse width modulated signal. It is to be understood, however, that in certain instances, other types of waveforms can be employed as the variable frequency signal that is compared with the instantaneous amplitude of the information signal.

As discussed supra, the frequency of the variable frequency wave which is compared with the information signal is related to the frequency of the information signal in a direct manner. In addition, the variable frequency is directly related to the energy or area under the curve of both half cycles of the information signal, i.e., to a function that is similar to an RMS value of the information signal.

In a preferred embodiment, a control signal for the frequency of the triangular wave source is derived by a first operational amplifier which is connected to a source of the information signal by a series connected differentiating capacitor for the information signal. A feedback path for the first operational amplifier includes diodes for causing the first operational amplifier to block portions of the differentiated signal having a first polarity and for deriving a replica of portions of the differentiated signal having a second polarity. A replica of the differentiated signal is linearly combined with the output signal of the first operational amplifier to derive a unidirectional signal having a waveshape that is a replica of both polarities of the differentiated signal. The unidirectional signal is integrated to derive the DC signal that is supplied to the oscillator. This circuitry incorporates integrated circuit components and the like, rather than bulky, expensive and heavy transformers or diode bridge rectifiers subject to diode knee losses.

It is, accordingly, still another object of the invention to provide a new and improved source of pulse width modulated signals having a variable frequency output that varies in a like manner with frequency variations of an information signal source controlling the modulator.

An additional object of the invention is to provide a new and improved variable frequency pulse width modulated signal source which derives pulse widths that vary as a function of the instantaneous amplitude of the information signal source driving the modulator, with frequency variations that vary in a like manner with the amplitude and frequency of the information source.

An additional object of the invention is to provide a new and improved source of pulse width modulated signals and a transmitter including same, wherein the frequency of the pulse width modulated signal varies in a like manner with the amplitude of an information signal source driving the modulator.

The above and still further objects, features and advantages of the present invention will become apparent upon consideration of the following detailed description of one specific embodiment thereof, especially when taken in conjunction with the accompanying drawings.

BRIEF DESCRIPTION OF THE DRAWINGS

FIG. 1 is a partial circuit and partial block diagram of a preferred embodiment of the present invention;

FIGS. 2, 3, 4 and 5 are waveforms helpful in describing the operation of the circuit of FIG. 1;

FIG. 6 is a circuit diagram of a preferred embodiment of a square wave pulse width modulator and amplifier included in the transmitter of FIG. 1; and FIGS. 7 and 8 are waveforms helpful in describing the operation of the circuit of FIG. 6.

BEST MODE FOR CARRYING OUT THE INVENTION

Reference is now made to FIG. 1 of the drawing wherein an embodiment of the radio frequency, amplitude modulated transmitter of the invention is illustrated as including an audio frequency signal source 11 which drives square wave pulse width modulator and amplifier 12, having a high output impedance. Amplifier 12 drives grid 13 of power pulse amplifier tube 14 by way of pulse shaping network 15. Tube 14 has an anode-cathode path connected to B+ terminal 16 that is DC coupled by way of low pass filter 17 to the anode-cathode circuit of radio frequency power amplifier tube 18 having grid 19 connected to radio frequency carrier source 21 and to DC bias source 22. The anode-cathode circuit of tube 18 includes antenna coupling circuit 23 which is connected to antenna 24.

Details of the operation of FIG. 1 are now described, assuming that pulse shaping circuit 15 is not provided.

Audio frequency source 11 can be any suitable source, such as speech, music, sinusoidal tones, square waves, triangular waves, or variations thereof. Several times during each cycle of source 11, square wave pulse width modulator and amplifier 12 derives a pulse having a duration that is a function of the instantaneous amplitude of source 11. The output of square wave pulse width modulator and amplifier 12 is a bilevel signal, having a constant positive voltage, alternating with zero voltage levels. Relatively long positive and zero voltage levels are derived at the output of square wave pulse width modulator and amplifier 12 in response to the instantaneous output of source 11 being high and low, respectively.

The bias voltage applied to grid 13 of power pulse amplifier tube 14 and the amplitude of the pulse output of square wave pulse width modulator and amplifier 12 are such that the anode-cathode path of tube 14 is alternately driven between hard saturation and cutoff. Thereby, a constant, relatively high current level flows from B+ terminal 16 through the anode-cathode path of tube 14 to low pass filter 17 and the anode-cathode path of tube 18 while a positive pulse amplitude is derived by square wave pulse width modulator and amplifier 12. In contrast, no current flows from B+ terminal 16 to low pass filter 17 while tube 14 is backbiased, i.e., cutoff, by the bias voltage applied to grid 13 at the time a zero voltage level is derived from square wave pulse width modulator and amplifier 12.

Low pass filter 17 responds to the variable duration relatively high current pulses supplied to it by way of the anode-cathode path of tube 14, to convert these current pulses into a relatively high current level that is supposed to be a replica of the current waveform of audio frequency source 11. The output of low pass filter 17 which is supposed to be replica of the waveform of audio frequency source 11 controls the impedance of the anode-cathode circuit of tube 18 and loading of antenna coupling circuit 23.

Preferably, the amplitudes of carrier source 21 and bias source 22 are such that tube 18 operates in Class C to provide maximum operating efficiency. It is to be understood, however, that carrier source 21 and bias source 22 can be connected to grid 19 in such a manner as to cause tube 18 to operate in Class AB or Class B operation.

Preferably, pulse power amplifier tube 14 is a tetrode, having a screen grid 25 appropriately energized by DC bias circuit 26. Despite the fact that power pulse amplifier tube 14 is a tetrode, it has appreciable shunt capacitance between the anode and cathode thereof. In addition, there is additional stray capacitance in the amplifier system including tubes 14 and 18 and the circuitry associated therewith. This stray capacity associated with the amplifying system is coupled back to the output terminals of square wave pulse width modulator and amplifier 12. As a result of the stray capacity at the output terminals of square wave pulse width modulator and amplifier 12, transitions in the output pulse waveform of square wave pulse width modulator amplifier 12 do not have the idealized vertical waveshape. The shortest duration pulses which are derived by circuit 12 during the maximum negative peak portions of the highest amplitude cycles of audio frequency source 11 have a tendency to be lengthened to such an extent that when they are smoothed or integrated by low pass filter 17 an inaccurate replica of the waveshape of audio frequency source 11 is applied as a modulating voltage for the anode-cathode path of tube 18.

An example of the effect of the short duration pulses is illustrated in the waveforms of FIGS. 2–4, based upon the assumption that audio frequency source 11 is deriving a sinusoidal waveshape, one cycle of which is illustrated as waveform 31, FIG. 2. Square wave pulse width modulator and amplifier 12 responds to waveform 31 to derive a pulse width modulated waveshape.

An idealized output waveform of circuit 12 in response to waveform 31 is illustrated in FIG. 3 as square wave 32. Square wave 32 has a zero base and vertical leading and trailing transitional edges and a constant amplitude high voltage level. In response to the positive half-cycle of sinusoidal waveform 31, square wave 32 has relatively long duration positive, constant amplitude levels, interspersed with short duration zero amplitude levels. As the amplitude of waveform 31 decreases, the durations of the positive and zero levels of square wave 32 respectively decrease and increase. When waveform 31 has a peak negative voltage, the durations of the positive portions of square wave 32 are much less than the durations of the zero amplitude levels of the square wave.

If it is assumed that shaping circuit 15 is not provided, the stray capacity of the amplifying system, as reflected to the output terminals of square wave pulse width modulator and amplifier 12, causes the output of the modulator and amplifier 12 to be distorted, as illustrated in FIG. 4 by waveform 34. From FIG. 4 it is noted that the vertical transitions of the leading and trailing edges of square wave 32 are converted into waveforms having appreciable slope. The slopes in the transitions of waveform 34 occur because the stray shunt capacity across the output terminals of modulator and amplifier 12 cannot respond instantly to the transitions of square wave 32. The sloping transitions of waveform 34 increase the area under each pulse, i.e., the area between the positive value of the pulse and the zero base line thereof.

Because the area under each of the pulses of waveform 34 is increased, the amplitude of the output of low pass filter 17 is not as accurate a replica of audio frequency source 11 as is desired. The amplitude modulated wave coupled to antenna 24 is thereby distorted, such that there is a greater amount of energy transmitted by the antenna to represent the instantaneous audio frequency source variations. The distortion is not particularly noticeable when information signal 31 has a high amplitude and the pulses derived by modulator and amplifier 12 are relatively long. This is because the percentage of the area added to these pulses due to the sloping transitions is not appreciable. However, for short duration pulses, i.e., pulses having a duration less than a predetermined interval, e.g. 10 microseconds, the percent distortion is enough to appreciably adversely affect the nature of the transmitted signal. In particular, pulse 33 in idealized square wave 32, as occurs in proximity to the minimum value of waveform 31, is distorted significantly, as indicated by distorted pulse 35. The area under the curve of pulse 35 is an appreciable percentage, such as 33%, greater than the area under idealized pulse 33.

Shaping network 15 responds to the output of modulator and amplifier 12, as represented by waveform 34, to decrease the amplitude of only those short duration pulses having an area increase sufficiently great to cause significant distortion in the output of the AM wave transmitted from antenna 24. The amplitude decrease caused by circuit 15 is sufficient to cause power pulse amplifier tube 14 to be driven out of saturation, but not into cutoff, in response to the short duration pulses. Thereby, the current coupled by amplifier 14 to low pass filter 17 in response to each short duration output pulse of modulator and amplifier 12, when smoothed or integrated by filter 17, causes an accurate replica of source 11 to be coupled to the DC power supply for the anode-cathode circuit of tube 18 and antenna coupling circuit 23. Because power pulse amplifier tube 14 is driven to saturation by all output pulses of modulator and amplifier 12 other than those few pulses which have a short enough duration to cause appreciable distortion in the output of low pass filter 17, tube 14 is operated with optimum efficiency.

Circuit 15 thus responds to waveform 34 to derive waveform 36 (FIG. 5) which is coupled to grid 13 of power pulse amplifier tube 14. From waveform 36, it is noted that the amplitude of each pulse of waveform 34, except pulse 35, is preserved. The amplitude of pulse 35 is reduced, as indicated by pulse 37.

Circuit 15 basically includes a charging circuit 40 comprising the parallel combination of capacitor 41 and resistor 42 in shunt with the output of modulator and amplifier 12 and grid 13 of power pulse amplifier tube 14. Circuit 40 is connected to a switch in the form of the source drain path of field effect transistor 43. During each transition in the output of modulator and amplifier 12 and during each of the short duration pulses, such as pulse 35, switch 43 is closed to provide a low impedance path for the output of the modulator and amplifier, so that tube 14 is not driven into saturation. At the time associated with the short duration pulses terminating, switch 43 is open and the full output voltage of modulator and amplifier 12 is applied to grid 13.

In the preferred embodiment, the output of modulator and amplifier 12 varies between zero and +650 volts, and a negative 400 volt DC level at terminal 44 is connected via a variable impedance DC path to grid 13 of tube 14. The bias voltage at terminal 44 is DC coupled to grid 13 by way of bias resistor 45. Thereby, the anode-cathode path of amplifier tube 14 is maintained at cutoff while a zero level is derived from modulator and amplifier 12, but is driven into hard saturation because of the 250 volt positive bias applied across resistor 45 when the modulator and amplifier derives a high, 650 volt output level.

The voltage variations at the output of modulator and amplifier 12 are coupled to grid 13 by way of resistor 46, shunted by inductor 47, connected between grid 13 and the output of the modulator and amplifier. During transitions of the output of modulator and amplifier 12, the output of the modulator and amplifier is coupled to grid 13 by way of resistor 46; during this time, inductor 47 has a high impedance and effectively is an open circuit. During relatively long output pulses of modulator and amplifier 12, the impedance of inductor 47 decreases and the inductor becomes virtually a short circuit for resistor 46. Thereby, grid 13 is maintained in saturation, because of the increased voltage applied to the grid by the output of modulator and amplifier 12 in the latter portions of long duration output pulses of the modulator and amplifier.

Increasing the bias voltage applied to grid 13 for long duration pulses is necessary to maintain tube 14 in saturation. It is essential that tube 14 be driven to grid saturation to deliver long duration current pulses from B+ terminal 16 to low pass filter 17 and the anode-cathode circuit of tube 18 during intervals of minimum instantaneous plate voltage of tube 18, caused by the large positive amplitude AC carrier segments of source 21. This requirement causes large current loading f grid 13; the large grid current loading must be maintained throughout the length of the long pulses. The high current requirements of grid 13 cause a voltage drop in resistor 46, which would result in tube 14 not being driven into saturation, except for the presence of inductor 47. As described supra inductor 47 effectively short circuits resistor 46 during the latter portions of the long duration pulses derived from modulator and amplifier 12. Maintaining tube 14 in saturation during the long current pulses is desirable because of the finite energy capabilities of the power supply connected to terminal 16. Because of the finite energy of the power supply connected to terminal 16, there is a tendency for the current supplied by tube 14 and the voltage at the input of low pass filter 17 to droop somewhat toward the end of long duration pulses. By increasing the forward bias applied by the output of modulator and amplifier 12 to grid 13 toward the end of these pulses, this drooping tendency is obviated.

Transitions in the output of modulator and amplifier 12 are coupled through capacitor 41 to gate 48 of FET 43 by way of diodes 49 and 50, capacitor 52 and a voltage divider including resistors 53 and 54. The forward bias voltage applied to gate 43 causes a low impedance to be provided between drain 55 and source 56 of FET 43, to provide a low impedance path for the current flowing through capacitor 41 and diode 49. The low impedance source drain path of field effect transistor 43 is maintained for a predetermined duration, equal to the duration of the shortest pulses in waveform 34 which are to be reduced in amplitude.

The voltage at gate 48 of field effect transistor 43 drops to a value which causes cutoff of the source drain path of the field effect transistor when circuit 40 has been charged by the output of modulator and amplifier 12 for an interval equal to the duration of the shortest pulses to be reduced in amplitude. As current flows through capacitor 41 with the source drain path of field effect transistor 43 in a low impedance state, current flows through capacitor 41 to charge the capacitor and cause the voltage across the capacitor to increase. The increased voltage across capacitor 41 causes the voltage and current supplied to the voltage divider including resistors 53 and 54 to decrease. When the voltage supplied by the voltage divider to gate 48 drops sufficiently, FET switch 43 is effectively open circuited and the impedance between drain 55 and source 56 increases. Open circuiting FET switch 43 removes a relatively low impedance load from the output of modulator and amplifier 12 and enables grid 13 to be driven into saturation. In other words, while the source drain path of FET 43 has a low impedance, the −400 volt bias at terminal 44 is coupled via a relatively low impedance path directly to grid 13 to prevent tube 14 from being driven into saturation by the 650 volt output of modulator and amplifier 12. When FET switch 43 is open circuited, the 650 volt output of modulator and amplifier 12 is applied to grid 13, to drive amplifier tube 14 into saturation.

The time constant of charge-discharge circuit 40, including capacitor 41 and resistor 42, determines the length of time FET switch 43 is forward biased. The time constant of circuit 40 is designed to be only as long as the narrow pulses which require shaping for distortion reduction. Because switch 43 is open circuited for virtually the entire length of the longer pulses, capacitor 41 remains charged throughout the duration of the longer pulses and has no significant effect on the amplitude or shape thereof.

To enable gate 48 of FET 43 to be forward biased in response to each positive going transition in the output of modulator and amplifier 12 the charge accumulated on capacitor 52 is drained through resistor 57, which shunts the capacitor. The voltage divider comprising resistors 53 and 54 provides the proper turn on or forward bias voltage for gate 48 of FET 43. Zener diode 58, shunting the gate drain path of FET 43, fixes the voltage between the gate and source and protects the FET. Resistor 59, connected between source 56 and terminal 44, provides a small amount of negative feedback for FET 43, to improve the performance thereof. Capacitor 61, in shunt with terminal 44, decouples the DC power supply connected to terminal 44 with the remaining circuitry, to prevent interaction between them. Resistor 45 is necessary because of the high impedance output of modulator and amplifier 12, to provide a return current path between grid 13 and terminal 44 and assure that tube 14 is cutoff. Diodes 49 and 50 are polarized so that positive current from modulator and amplifier 12 can flow through them to gate 48 and the source drain path of FET 43 in response to positive going transitions in the output of the modulator and amplifier, and to block current flow to the FET in response to negative going transitions in the output of the modulator and amplifier.

A preferred embodiment for square wave pulse width modulator and amplifier 12 is illustrated in FIG. 6. The pulse width modulator and amplifier 12 illustrated in FIG. 6 responds to a function similar to the RMS (rather than instantaneous) amplitude and frequency of audio frequency source 11 to derive variable frequency, constant amplitude pulse duration modulated pulses that are applied to pulse power amplifier 13. The frequency of the pulses derived by pulse width modulator and amplifier 12 increases and decreases as the RMS like amplitude function of audio frequency source 11 increases and decreases. In addition, the frequency of the pulses derived by modulator and amplifier 12 increases and decreases as the frequency of source 11 increases and decreases. The width of the variable duration pulses derived by modulator and amplifier 12 is directly proportional to the instantaneous amplitude of audio frequency source 11.

Because the frequency of the pulses derived by modulator and amplifier 12 is a direct function of amplitude of an RMS like function and frequency of source 11, there is high efficiency and low distortion in the audio modulated, RF output signal of the transmitter, as derived from antenna 24. Higher efficiency is attained through the use of a variable frequency output of modulator and amplifier 12 than for a fixed output frequency of the modulator and amplifier because there are fewer transitions required to replicate the audio frequency source during most of the program time of source 11. This promotes high efficiency because switching lossses in the circuitry associated with power pulse amplifier tube 14 increase directly as a function of the pulse operating frequency thereof. Because the ratio of pulse duration time to the transition or switching time of power pulse amplifier tube 14 is increased for the most part in the variable frequency modulator of the present invention, there are fewer switching losses in the power pulse amplifier tube.

The variable frequency output of modulator and amplifier 12 also enables distortion in the transmitter to be reduced. This is because the high frequencies of source 11 are sampled at a high frequency rate, which enables a larger number of samples to be coupled to low pass filter 17, to more accurately replicate the signal of source 11 at the output of the low pass filter. Distortion is also decreased because the frequency of the output of modulator and amplifier 12 is a direct function of the amplitude of audio frequency source 11. The distortion of RF-AM transmitters of the type illustrated in FIG. 1 increases at high audio frequencies with high levels of modulation, i.e., high level outputs of source 11. This distortion is reduced, in accordance with the present invention, by sampling the amplitude of the high audio frequencies at a frequency that is a direct function of both amplitude and frequency of source 11.

With zero program level, i.e., the output signal of audio frequency source 11 is a constant level at the lowest output voltage of source 11, pulses supplied by modulator and amplifier 12 to pulse shaper 15 and power pulse amplifier tube 14 dwell on the lowest frequency of the variable frequency range for which modulator and amplifier 12 is designed. The pulse duration has a typical quicscent value of 40% to 50% on time. The pulse duration increases or decreases with modulation level. Shaping network 15, power pulse amplifier tube 14 and low pass filter 17 respond to the short duration, minimum frequency output of modulator and amplifier 12, whereby the plate voltage of tube 18 is at a relatively low level and the output of the transmitter is at the frequency of carrier source 21, with a no modulation condition.

When audio frequency source 11 is deriving a program signal, the pulse frequency derived from modulator and amplifier 12 increases as necessary to handle the program content of source 11 with a minimum amount of distortion. It is important to consider the nature of the program content of source 11 to realize the value of the present invention in achieving high conversion efficiency. Ordinary speech contains practically no high frequencies, and almost all of the music tones are in the middle or low frequency range. High frequencies in music occur less often than the frequencies in the middle and low ranges, and are usually of relatively low amplitude. Therefore, a normal operating condition of the transmitter of the present invention causes the variable frequency pulse train derived from modulator and amplifier 12 to be in a small range of low frequencies most of the time. Because the output of modulator and amplifier 12 is a variable frequency pulse train having a small range of low frequencies most of the time, high efficiency results because there is a high ratio of pulse duration time to switching time for the greatest portion of the program time of source 11. Simultaneously, the distortion of higher frequency signals is avoided because the pulse output frequency of modulator and amplifier 12 increases for the high signal frequencies of the program of source 11.

Considering now, in detail, the preferred embodiment of pulse width modulator and amplifier 12, as illustrated in FIG. 6, the output of audio frequency source 11 is applied via terminal 71 to series connected differentiating capacitor 72, which passes the high frequencies of source 11 to a greater extent than the low frequencies, and thereby provides a rising frequency response. The signal coupled through capacitor 72 is applied to a halfwave rectifier 73 which reduces the amplitude of positive half cycles of the signal coupled through capacitor 72 virtually to zero and inverts the polarity of the negative half cycles of the signal passed through capacitor 72 into positive half cycle variations.

To these ends, halfwave rectifier and inverter 73 includes operational amplifier 74 having an inverting input terminal 75 connected to capacitor 72 via input resistor 76. Amplifier 74 includes an output terminal 77 which is coupled back to inverting input terminal 75 by way of a feedback network including diode 78 which is shunted by the series combination of diode 79 and resistor 80.

In operation, the positive half cycles at the junction between capacitor 72 and resistor 76 are attenuated virtually to zero by circuit 73 and decoupled from the junction of diode 79, and resistor 80. This is because diode 78 has a low impedance for positive signal voltage variations at terminal 75 to cause the transfer function of circuit 73, which is directly proportional to the feedback impedance of amplifier 74, to be almost zero. Any positive half cycle voltage variations at terminal 75 that are not attenuated result in low level negative voltage variations at output terminal 77 of amplifier 73. These low level negative voltage variations are blocked by diode 79 which they back bias. In response to negative half cycles at the junction of capacitor 72 and resistor 76, diode 78 is open circuited causing amplifier 73 to have a high feedback impedance and substantial gain, so that a positive replica of the negative half cycles is derived at output terminal 77 of inverting amplifier 74. The resulting positive voltage variations at output terminal 77 are coupled to the junction between diode 79 and resistor 80 because diode 79 is forward biased by the positive voltage derived at this time at terminal 77. Hence, positive half cycles of the voltage at the junction between capacitor 72 and resistor 76 are completely attenuated by circuit 73; negative half cycles of the voltage at the Junction of capacitor 72 and resistor 76 cause circuit 73 to function as an inverting operational amplifier.

Operational summing amplifier and integrator 83 linearly combines, i.e, adds, the positive halfwave rectified and inverted signal at the junction of diode 79 and resistor 80 with the voltage at the junction of capacitor 72 and resistor 76; these two signals are supplied to inverting input terminal 82 of amplifier 83. Inverting input terminal 82 is also responsive to a variable DC level derived from slider 84 of potentiometer 85, which is supplied with a negative DC voltage at terminal 86. The voltages at the junction of capacitor 72 and resistor 76, at the junction of diode 79 and resistor 80, and at slider 84 are respectively applied to input terminal 82 by way resistors 87, 88 and 89.

Operational amplifier 83 is connected as an integrator for the voltages applied to the input thereof, to derive a DC output signal proportional to an RMS like function of the amplitude of audio frequency source 11 added to a function that is directly related to the frequency of source 11. To this end, amplifier 83 includes output terminal 91, connected to inverting input terminal 82 by way of a feedback circuit including capacitor 92, shunted by resistor 93. The time constant of the integrator, as determined by the values of resistor 93 and capacitor 92, is slightly greater than the period of the lowest information frequency of source 11, as coupled to capacitor 72.

The DC output signal of amplifier 83 is applied to control input terminal 94 of constant amplitude, variable frequency triangular voltage controlled oscillator 95. The peak amplitude of the output of oscillator 95 is adjusted to exceed the peak amplitude of the output of source 11. The voltage applied to terminal 94 controls the frequency of the triangular waves derived by oscillator 95. The setting of potentiometer 84 controls the minimum frequency of the triangular wave output of oscillator 95, i.e, the frequency derived by the oscillator when audio frequency source 11 is deriving a constant amplitude, minimum level output signal. The values of resistors 87 and 88 are selected in such a manner as to cause the voltages supplied to these resistors to be additively combined in such a manner that the area under the curve of the combined voltage resulting from summation of the voltages applied to resistors 87 and 88 during both half cycles of the voltage at the junction between capacitor 72 and resistor 76 is proportional to the frequency and the RMS like function of the amplitude of the output of source 11.

During negative half cycles of the voltage at the terminal between capacitor 72 and resistor 76, the voltages coupled to resistors 87 and 88 are equal in amplitude, but the signal applied to resistor 87 is a full sine wave; whereas, the signal applied to resistor 88 is a positive going half wave cycle with a relatively flat waveshape between pairs of the half wave cycles. Resistor 88 typically has a resistance value that is one half of the resistance value of resistor 87. This causes the half wave replica to cancel, and to reverse the polarity of the full sine wave that is applied to resistor 87, causing a negative going full wave replica of the voltage at the terminal between capacitor 72 and resistor 76. The resulting voltage at input terminal 82 is a fullwave rectified replica of the voltage at the junction between capacitors 72 and 76 which can be thought of as a unidirectional signal having a waveshape that is a replica of both polarities of the differential signal. As a result of the differentiating action provided by capacitor 72, the area under the curve of both half cycles coupled to terminal 82 is a signal magnitude that is a direct function of the amplitude and frequency of the output of source 11. The area under the curve of the fullwave signal at input terminal 82 is integrated or smoothed by amplifier 83 and the circuitry associated therewith, so that the signal at output terminal 91 is a unidirectional DC signal having a magnitude that is a direct function of the amplitude and frequency of the audio signal supplied to terminal 71. Amplifier 83 and the circuitry associated with it can thus be considered as an integrator or low pass filter.

As the amplitude of the signal at terminal 71 increases, the amplitude of the signals supplied to resistors 87 and 88 during both half cycles of the voltage at the junction between capacitor 72 and resistor 76 increases. Because of the differentiating action of capacitor 72, the voltages applied to resistor 87 and 88 increase during both half cycles of the voltage at the junction of capacitors 72 and 76. The DC voltage derived at output terminal 91 of amplifier 83 causes the frequency of oscillator 95 to increase as a direct function. Hence, as the voltage applied to terminal 94 increases, the frequency of oscillator 95 correspondingly increases.

To provide a better understanding of why the DC voltage at terminal 91 is directly related to the frequency and an RMS like function of the amplitude of the voltage consider the operation of circuits 73 and 83 for three equal amplitude sine waves applied to terminal; the sine waves have intermediate, low and high frequencies. The intermediate frequency sine wave is attenuated to a moderate extent by capacitor 72. The resulting DC voltage at terminal 91 thereby represents the area under both half cycles of the signal at terminal 71, with moderate attenuation provided by capacitor 72. As the amplitude of the sine wave at terminal 71 increases and decreases the area under both half cycles integrated by integrator 83 increases and decreases to provide the RMS like amplitude function. For the low frequency signal at terminal 71, there is substantial attenuation by capacitor 72. The high frequency sine wave at terminal 71 is only slightly attenuated by capacitor 72. The time constant of integrator 83 is selected such that the amount of smoothing by the integrator is approximately the same for the low, intermediate and high frequencies. Thereby the voltages at terminal 91 for the low and high frequency sine waves are respectively less than and greater than the voltage at terminal 91 for the intermediate frequency. For all three frequencies the areas under both half cycles increase and decrease, as reflected at output terminal 91 of integrator 83, as the amplitudes of the sine waves increase and decrease.

The variable frequency, pulse duration, i.e., pulse width, modulated output of modulator and amplifier 12 is derived by comparing the amplitude of the output of oscillator 95 with the output of audio frequency source 11 and changing the level of a bilevel wave each time the relative polarity between the output of oscillator 95 and source 11 changes, i.e., each time there is a cross over between the outputs of source 11 and oscillator 95. To this end, the output of source 11, as coupled to terminal 71, is supplied to noninverting input terminal 96 of subtracting amplifier 97, having an inverting input terminal 98 responsive to the output of oscillator 95. Amplifier 97 subtracts the voltage at terminal 96 from the voltage at terminal 98 and amplifies the level of the resulting difference into a bilevel wave, such that when the voltage at terminal 96 exceeds the voltage at terminal 98, a positive level is derived at output terminal 99 of amplifier 97; the voltage level at output terminal 99 has a zero value in response to the voltage at terminal 98 exceeding the voltage at terminal 96. The bilevel signal is coupled as the +650 volt and zero volt input to power amplifier 14.

The operation of modulator and amplifier 12 can be appreciated by an inspection of the waveforms illustrated in FIGS. 7 and 8. In FIG. 7, waveform 101 is slightly more than one complete cycle of a sine wave tone derived from source 11. Waveform 102 is a triangular wave derived by voltage controlled oscillator 95 in response to the amplitude and frequency of the information signal derived from source 11. The peak amplitude of triangular wave 102 is slightly in excess of the peak amplitude of sine wave 101; many cycles of the triangular wave 102 are derived during a single cycle of the sine wave source, with the ratio of the triangular wave frequency to the frequency of source 11 remaining somewhat constant. The output of subtracting amplifier 97, at terminal 99, in response to waves 101 and 102, as respectively coupled to input terminals 96 and 98 of amplifier 97, is illustrated by waveform 103, FIG. 8. From waveform 103, it is noted that a transition occurs each time sinusoidal wave 101 crosses triangular wave 102. Narrow pulses occur in waveform 103 during the peak portions of the negative half cycle of sine wave 101, while long pulses occur in waveform 103 during the peak portions of each positive half cycle of the sine wave. During intermediate portions of sine wave 101, in the vicinity of the average value thereof and of triangular wave 102, the pulses of waveform 103 have relatively intermediate values.

As the frequency and amplitude of sine wave 101 decreases, there are corresponding decreases in the frequency, but not amplitude, of triangular wave 102. Thereby, the widths of the bilevel output pulses of amplifier 97 increase and decrease during the negative and positive half cycles of a sine wave output of audio frequency source 11. The time constant of low pass filter 17 is such that the square wave variations in the output of amplifier 12 are reconstituted as an accurate replica of the output of audio frequency source 11.

While there as been described and illustrated one specific embodiment of the invention, it will be clear that variations in the details of the embodiment specifically illustrated and described may be made without departing from the true spirit and scope of the invention as defined in the appended claims. For example, other circuitry can be used to derive an input to voltage controlled oscillator 95 as a function of the frequency and RMS like functions of the amplitude of the output of audio frequency source 11. In addition, under certain circumstances, constant amplitude, triangular wave variable frequency oscillator 95 can be driven by a DC voltage that solely represents the amplitude of the output of audio frequency source 11 or which represents only the frequency of the output of source 11. While other circuits can be employed for pulse width modulator and amplifier 12, the specifically illustrated circuit has the advantage of being solely electronic, without the need for isolation transformers and diode bridges which could be incorporated in other configurations for driving oscillator 95. Of course, isolation transformers are bulky and heavy and diode bridges suffer from problems associated with diode knee losses. Proper adjustment of the values of capacitors 72 and 92, as well as resistors 76, 87 and 93 controls the attack time for variations of the DC control voltage applied to oscillator 95 to provide proper delay for a suitable transition speed for the change in output frequency of the oscillator. The values of these components can easily be changed to provide the proper delay in the rate at which the frequency of oscillator 95 is changed. Further the variable frequency waveshape derived by oscillator 95 need not be triangular, but must have a constantly changing slope. Otherwise the sampling process of signal source 11, which occurs at amplitude crossovers between the outputs of oscillator 95 and the signal source, does not enable the signal to be accurately replicated at the input of RF amplifier tube 18.

I claim:

1. A radio transmitter for transmitting an RF carrier amplitude modulated by an information signal comprising a pulse width modulator responsive to the information signal for deriving a pulse width modulated signal having pulses with widths representing the instantaneous amplitude of the information signal and a frequency that is a direct function of the frequency and an RMS like function of the amplitude of the information signal, the RMS like function including the integral of a single polarity function of the information signal, a power amplifier responsive to the pulse width modulated signal including a power amplifying element connected to a DC power supply terminal, the power amplifying element deriving a high power signal that is a substantial replica of the pulse width modulated signal, a low pass filter responsive to the high power signal for deriving a signal that is a substantial replica of the information signal, and an RF amplifier having an anode-cathode path in DC circuit with the DC power supply terminal via the low pass filter and the power amplifying element.

2. The transmitter of claim 1 wherein the pulse width modulator includes a variable frequency oscillator for deriving an output wave having a constantly changing amplitude, means responsive to the information signal for supplying a DC signal having a magnitude that changes as a function of frequency and the RMS like function of the amplitude of the information signal to the oscillator, the oscillator responding to the DC signal so the oscillator output frequency increases as the frequency and the RMS like function of the amplitude of the information signal increase.

3. The transmitter of claim 2 wherein the pulse width modulated signal is a bilevel signal, the modulator further including means for controlling transitions of the bilevel signal so that each transition in said bilevel signal occurs in synchronism with each change in the relative polarity of the information signal and the output wave.

4. The transmitter of claim 2 wherein the modulator includes rectifier means, means for AC coupling a signal indicative of the information signal to the rectifier means, and integrator means responsive to an output signal of the rectifier means for deriving the DC signal that is supplied to the oscillator.

5. The transmitter of claim 2 wherein the modulator includes an operational amplifier, a capacitor series connected between a source of said information signal and an input of said operational amplifier for differentiating said information signal and for coupling said differentiated signal to said operational amplifier, a feedback path connected to said operational amplifier including means for causing said operational amplifier to block portions of said differentiated signal having a first polarity and for deriving a replica of portions of said differentiated signal having a second polarity, means for linearly combining a replica of said differentiated signal and an output signal of the operational amplifier to derive a unidirectional signal having a waveshape that is a replica of both polarities of said differentiated signal, and means for integrating the unidirectional signal to derive the DC signal that is supplied to the oscillator.

6. The transmitter of claim 2 wherein the output wave has a triangular shape as a function of amplitude and time.

7. An AM radio transmitter for transmitting an RF carrier amplitude modulated by an information signal having variable amplitude and frequency characteristics comprising a pulse width modulator responsive to the information signal for deriving a pulse width modulated signal having pulses with widths representing the instantaneous amplitude of the information signal and a variable frequency that is a function of at least one of said characteristics of the information signal, said modulator including a variable frequency oscillator for deriving an output wave having a constantly changing amplitude, means responsive to the information signal for supplying a DC signal having a magnitude that changes as a function of at least one of said characteristics of the information signal to the oscillator to control the frequency of the output wave, the pulse width modulated signal being a bilevel signal, the modulator including means for controlling transitions of the bilevel signal so that each transition in said bilevel signal occurs in synchronism with each change in the relative polarity of the information signal and the oscillator output wave, and means responsive to a smoothed replica of the pulse width modulated bilevel signal for deriving the RF amplitude modulated carrier.

8. The transmitter of claim 7 wherein the function for the frequency of the pulses is a direct function of the amplitude of said information signal so that as the amplitude of the information signal increases the frequency of the pulses increases.

9. The transmitter of claim 8 wherein the modulator includes rectifier means, means for coupling a signal responsive to the information signal to the rectifier means, and integrator means responsive to an output signal of the rectifier means for deriving the DC signal that is supplied to the oscillator.

10. The transmitter of claim 8 wherein the function for the frequency of the pulses is a direct function of the frequency of said information signal so that as the frequency of the information signal increases the frequency of the pulses increases.

11. The transmitter of claim 7 wherein the output wave has a triangular shape as a function of amplitude and time.

12. The radio transmitter of claim 7 wherein the DC control signal deriving means includes an operational amplifier, a capacitor series connected between a source of said information signal and an input of said operational amplifier for differentiating said information signal and for coupling said differentiated signal to said operational amplifier, a feedback path connected to said operational amplifier including means for causing said operational amplifier to block portions of said differentiated signal having a first polarity and for deriving a replica of portions of said differentiated signal having a second polarity, means for linearly combining a replica of said differentiated signal and an output signal of the operational amplifier to derive a unidirectional signal having a waveshape that is a replica of both polarities of said differentiated signal, and means for integrating the unidirectional signal to derive the DC signal that is supplied to the oscillator.

13. The transmitter of claim 7 wherein the function for the frequency of the pulses is a direct function of the frequency of said information signal so that as the frequency of the information signal increases the frequency of the pulses increases.

14. A source of pulse width modulated pulses having a variable frequency that is a function of an AC information signal comprising a variable frequency voltage controlled oscillator for deriving a variable frequency output wave having a continuously varying amplitude, rectifying means responsive to the AC information signal for deriving a DC control voltage for the oscillator, the oscillator responding to the DC control voltage to derive the variable frequency output wave, and means responsive to the AC information signal and the output wave for deriving a variable frequency bilevel pulse width modulated signal having pulse widths that are a function of the instantaneous amplitude of the AC input signal so the frequency of the pulse width modulated signal increases as the amplitude of the AC signal increases and vice versa, said last named means including means for controlling transitions of the bilevel signal so that each transition in said bilevel signal occurs in synchronism with each change in the relative polarity of the information signal and the continuously varying amplitude output wave.

15. The source of claim 14 wherein the DC control signal deriving means includes means responsive to the AC information signal for causing the oscillator frequency to vary directly with the amplitude and frequency of the AC information signal.

16. The source of claim 14 wherein the DC control signal deriving means includes means responsive to the AC information signal for causing the oscillator frequency to vary directly with the amplitude and frequency of the AC information signal, the DC control signal deriving means including an operational amplifier, a capacitor series connected between a source of said information signal and an input of said operational amplifier for differentiating said information signal and for coupling said differentiated signal to said operational amplifier, a feedback path connected to said operational amplifier including means for causing said operational amplifier to block portions of said differentiated signal having a first polarity and for deriving a replica of portions of said differentiated signal having a second polarity opposite to the first polarity, means for linearly combining a replica of said differentiated signal and an output signal of the operational amplifier to derive a unidirectional signal having a waveshape that is a replica of both polarities of said differentiated signal, and means for integrating the unidirectional signal to derive the DC signal that is supplied to the oscillator.

17. The source of claim 14 wherein the DC control signal deriving means includes an operational amplifier, impedance means connected between a source of said information signal and an input of said operational amplifier for feeding a signal that is a first function of the information signal to the input of said operational amplifier, a feedback path connected to said operational amplifier including means for causing said operational amplifier to block portions of the input signal of the operational amplifier having a first polarity and for deriving a replica of portions of the input signal of the operational amplifier having a second polarity, means for linearly combining a replica of said signal that is a function of the information signal and an output signal of the operational amplifier to derive a unidirectional signal having a waveshape that is a replica of both polarities of said differentiated signal, and means for integrating the unidirectional signal to derive the DC signal that is supplied to the oscillator.

18. The source of claim 14 wherein the DC control signal deriving means includes means responsive to the AC information signal for causing the oscillator frequency to vary directly with the amplitude and frequency of the AC information signal.

19. The source of claim 18 wherein the DC control signal deriving means includes an operational amplifier, impedance means connected between a source of said information signal and an input of said operational amplifier, a feedback path for said operational amplifier including means for causing said operational amplifier to block portions of the input signal of the operational amplifier having a first polarity and for deriving a replica of portions of the input signal of the operational amplifier having a second polarity, means for linearly combining a replica of said differentiated signal and an output signal of the operational amplifier to derive a unidirectional signal having a waveshape that is a replica of both polarities of said differentiated signal, and means for integrating the unidirectional signal to derive the DC signal that is supplied to the oscillator.

20. The source of claim 14 wherein the DC control signal deriving means includes rectifier means, means for coupling a signal indicative of the information signal to the rectifier means, and integrator means responsive to an output signal of the rectifier means for deriving the DC signal that is supplied to the oscillator.

21. The source of claim 14 wherein the DC control signal deriving means includes an operational amplifier, a capacitor series connected between a source of said information signal and an input of said operational amplifier for differentiating said information signal and for coupling said differentiated signal to said operational amplifier, a feedback path connected to said operational amplifier including means for causing said operational amplifier to block portions of said differentiated signal having a first polarity and for deriving a replica of portions of said differentiated signal having a second polarity, means for linearly combining a replica of said differentiated signal and an output signal of the operational amplifier to derive a unidirectional signal having a waveshape that is a replica of both polarities of said differentiated signal, and means for integrating the unidirectional signal to derive the DC signal that is supplied to the oscillator.

22. The source of claim 14 wherein the DC control signal deriving means includes an operational amplifier, impedance means connected between a source of said information signal and an input of said operational amplifier for feeding a signal that is a first function of the information signal to the input of said operational amplifier, a feedback path connected to said operational amplifier including means for causing said operational amplifier to block portions of the input signal of the operational amplifier having a first polarity and for deriving a replica of portions of the input signal of the operational amplifier having a second polarity, means for linearly combining a replica of said signal that is a function of the information signal and an output signal of the operational amplifier to derive a unidirectional signal having a waveshape that is a replica of both polarities of said differentiated signal, and means for integrating the unidirectional signal to derive the DC signal that is supplied to the oscillator.

23. The transmitter of claim 14 wherein the output wave having a continuously varying amplitude is a triangular wave as a function of amplitude and time.

24. A radio transmitter for transmitting an RF carrier amplitude modulated by an information signal comprising a pulse width modulator responsive to the information signal for deriving a pulse width modulated signal having pulses with widths representing the instantaneous amplitude of the information signal and a frequency that is a direct function of an RMS like function of the amplitude of the information signal so that as the amplitude of the RMS like function increases the frequency of the pulse width modulated signal increases and vice versa, the RMS like function including the integral of a single polarity function of the information signal, a power amplifier responsive to the pulse width modulated signal including a power amplifying element connected to a DC power supply terminal, the power amplifying element deriving a high power signal that is a substantial replica of the pulse width modulated signal, a low pass filter responsive to the high power signal for deriving a signal, and an RF amplifier having an anode-cathode path in DC circuit with the DC power supply terminal via the low pass filter and the power amplifying element.

25. The transmitter of claim 24 wherein the pulse width modulator includes a variable frequency oscillator for deriving an output wave having a constantly changing amplitude, means responsive to the information signal for supplying a DC signal having a magnitude that changes as a function of the RMS like function of the amplitude of the information signal to the oscillator, the oscillator responding to the DC signal so the oscillator output frequency increases as the RMS like function of the amplitude of the information signal increases.

26. The transmitter of claim 25 wherein the pulse width modulated signal is a bilevel signal, the modulator further including means for controlling transitions of the bilevel signal so that each transition in said bilevel signal occurs in synchronism with each change in the relative polarity of the information signal and the output wave.

27. The transmitter of claim 25 wherein the modulator includes rectifier means, means for AC coupling a signal indicative of the information signal to the rectifier means, and integrator means responsive to an output signal of the rectifier means for deriving the DC signal that is supplied to the oscillator.

28. The transmitter of claim 25 wherein the modulator includes an operational amplifier, a capacitor series connected between a source of said information signal and an input of said operational amplifier for differentiating said information signal and for coupling said differentiated signal to said operational amplifier, a feedback path connected to said operational amplifier including means for causing said operational amplifier to block portions of said differentiated signal having a first polarity and for deriving a replica of portions of said differentiated signal having a second polarity, means for linearly combining a replica of said differentiated signal and an output signal of the operational amplifier to derive a unidirectional signal having a waveshape that is a replica of both polarities of said differentiated signal, and means for integrating the unidirectional signal to derive the DC signal that is supplied to the oscillator.

29. The transmitter of claim 25 wherein the output wave has a triangular shape as a function of amplitude and time.

30. The transmitter of claim 24 wherein said pulse width modulator includes means responsive to the information signal for deriving a signal having a magnitude that is directly related to the RMS like function of the amplitude of the information signal.

31. The transmitter of claim 24 wherein the RMS like function is the average value of a rectified replica of the information signal.

32. The transmitter of claim 24 wherein the RMS like function is the average value of a fullwave rectified replica of the information signal.

33. An AM radio transmitter for transmitting an RF carrier amplitude modulated by an information signal having variable amplitude and frequency characteristics comprising a pulse width modulator responsive to the information signal for deriving a pulse width modulated signal having pulses with widths representing the instantaneous amplitude of the information signal and a frequency that is a direct function of the amplitude of the information signal so that as the amplitude of the information signal increases the frequency of the pulse width modulated signal increases and vice versa, said modulator including a variable frequency oscillator for deriving an output wave having a constantly changing amplitude, means responsive to the information signal for supplying a DC signal having a magnitude that changes as a function of one of said characteristics of the information signal to the oscillator to control the frequency of the output wave in accordance with said function, the pulse width modulated signal being a bilevel signal, the modulator including means for controlling transitions of the bilevel signal so that each transition in said bilevel signal occurs in response to changes in the relative polarity of the information signal and the oscillator output wave, and means responsive to a smoothed replica of the pulse width modulated bilevel signal for deriving the RF amplitude modulated carrier.

34. The source of claim 33 wherein the DC control signal deriving means includes an operational amplifier, a capacitor series connected between a source of said information signal and an input of said operational amplifier for differentiating said information signal and for coupling said differentiated signal to said operational amplifier, a feedback path connected to said operational amplifier including means for causing said operational amplifier to block portions of said differentiated signal having a first polarity and for deriving a replica of portions of said differentiated signal having a second polarity, means for linearly combining a replica of said differentiated signal and an output signal of the operational amplifier to derive a unidirectional signal having a waveshape that is a replica of both polarities of said differentiated signal, and means for integrating the unidirectional signal to derive the DC signal that is supplied to the oscillator.

35. An AM radio transmitter for transmitting an RF carrier amplitude modulated by an information signal comprising a pulse width modulator responsive to the information signal for deriving a pulse width modulated signal having pulses with widths representing the instantaneous amplitude of the information signal and a variable frequency that is a function of the information signal so that as the amplitude of the information signal increases the frequency of the pulse width modulated signal increases and as the frequency of the information signal increases the frequency of the pulse width modulated signal increases, and means responsive to a smoothed replica of the pulse width modulated signal for deriving the RF amplitude modulated carrier.

* * * * *